United States Patent
Watanabe et al.

(10) Patent No.: US 11,251,143 B2
(45) Date of Patent: Feb. 15, 2022

(54) SEMICONDUCTOR DEVICE AND METHOD OF MANUFACTURING THE SAME

(71) Applicant: SUMITOMO ELECTRIC INDUSTRIES, LTD., Osaka (JP)

(72) Inventors: Masataka Watanabe, Osaka (JP); Naoya Kono, Osaka (JP); Takehiko Kikuchi, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 16/573,641

(22) Filed: Sep. 17, 2019

(65) Prior Publication Data

US 2020/0105691 A1    Apr. 2, 2020

(30) Foreign Application Priority Data

Sep. 28, 2018   (JP) .............................. JP2018-184526

(51) Int. Cl.
*H01L 23/00* (2006.01)
*G02F 1/225* (2006.01)
*G02F 1/21* (2006.01)

(52) U.S. Cl.
CPC .............. *H01L 24/05* (2013.01); *G02F 1/225* (2013.01); *H01L 24/03* (2013.01); *G02F 1/212* (2021.01); *H01L 2224/0346* (2013.01); *H01L 2224/05083* (2013.01); *H01L 2224/05144* (2013.01); *H01L 2224/05166* (2013.01); *H01L 2224/05169* (2013.01); *H01L 2224/05184* (2013.01); *H01L 2924/3512* (2013.01)

(58) Field of Classification Search
CPC .............................. G02F 1/212; G02B 6/2935
See application file for complete search history.

(56) References Cited

U.S. PATENT DOCUMENTS

| 2012/0314725 | A1  | 12/2012 | Nakanishi et al. |
| 2016/0011439 | A1* | 1/2016  | Kitamura .............. G02F 1/218 385/2 |
| 2016/0026064 | A1* | 1/2016  | Masuyama ............ G02F 1/025 385/2 |
| 2016/0380023 | A1* | 12/2016 | Yoneda ............... H01L 27/1446 257/432 |

FOREIGN PATENT DOCUMENTS

| JP | 2012-252290 | 12/2012 |
| WO | 2017-212888 | 12/2017 |

* cited by examiner

*Primary Examiner* — Moin M Rahman
*Assistant Examiner* — Mohammad A Rahman
(74) *Attorney, Agent, or Firm* — Smith, Gambrell & Russell, LLP.

(57) ABSTRACT

A semiconductor device includes: a semiconductor layer formed on a substrate; a first resin layer formed on the semiconductor layer; a second resin layer formed on the first resin layer; a first wiring layer that is formed on the semiconductor layer and is buried in the second resin layer; a second wiring layer that is formed on the second resin layer and the first wiring layer, and is electrically connected to the first wiring layer; and a first inorganic insulating film covering the second resin layer and the second wiring layer, wherein an area of the first wiring layer is larger than an area of the second wiring layer.

8 Claims, 9 Drawing Sheets

SEMICONDUCTOR DEVICE AND METHOD OF MANUFACTURING THE SAME

CROSS-REFERENCE TO RELATED APPLICATION

This application is based upon and claims the benefit of priority of the prior Japanese Patent Application No. 2018-184526, filed on Sep. 28, 2018, the entire contents of which are incorporated herein by reference.

BACKGROUND

(i) Technical Field

The present invention relates to a semiconductor device and a method of manufacturing the semiconductor device.

(ii) Related Art

In a semiconductor device, a semiconductor layer may be buried with resin or the like, and a wiring layer may be formed on the semiconductor layer (WO 2017/212888 A and Japanese Patent Application Laid-Open No. 2012-252290).

SUMMARY

To improve protection properties and moisture resistance of resin, the upper surface of a resin may be covered with an inorganic insulating film. However, the inorganic insulating film has a different linear expansion coefficient from those of the wiring lines and the resin, and therefore, cracks will appear in the inorganic insulating film. To counter this, an embodiment of the present invention aims to provide a semiconductor device capable of reducing or preventing crack formation in an inorganic insulating film, and a method of manufacturing the semiconductor device.

According to an aspect of the present invention, there is provided a semiconductor device including: a semiconductor layer formed on a substrate; a first resin layer formed on the semiconductor layer; a second resin layer formed on the first resin layer; a first wiring layer that is formed on the semiconductor layer and is buried in the second resin layer; a second wiring layer that is formed on the second resin layer and the first wiring layer, and is electrically connected to the first wiring layer; and a first inorganic insulating film covering the second resin layer and the second wiring layer, wherein an area of the first wiring layer is larger than an area of the second wiring layer.

According to another aspect of the present invention, there is provided a method of manufacturing a semiconductor device, including: growing a semiconductor layer on a substrate; forming a mesa by performing dry etching on the semiconductor layer; forming a first resin layer on the semiconductor layer, the first resin layer burying the mesa; forming a first wiring layer above the mesa; forming a second resin layer on the first resin layer; forming a second wiring layer on the second resin layer, the second wiring layer being electrically connected to the first wiring layer; and forming a first inorganic insulating film covering the second resin layer and the second wiring layer, wherein an area of the first wiring layer is larger than an area of the second wiring layer.

DETAILED DESCRIPTION

Figure 1:
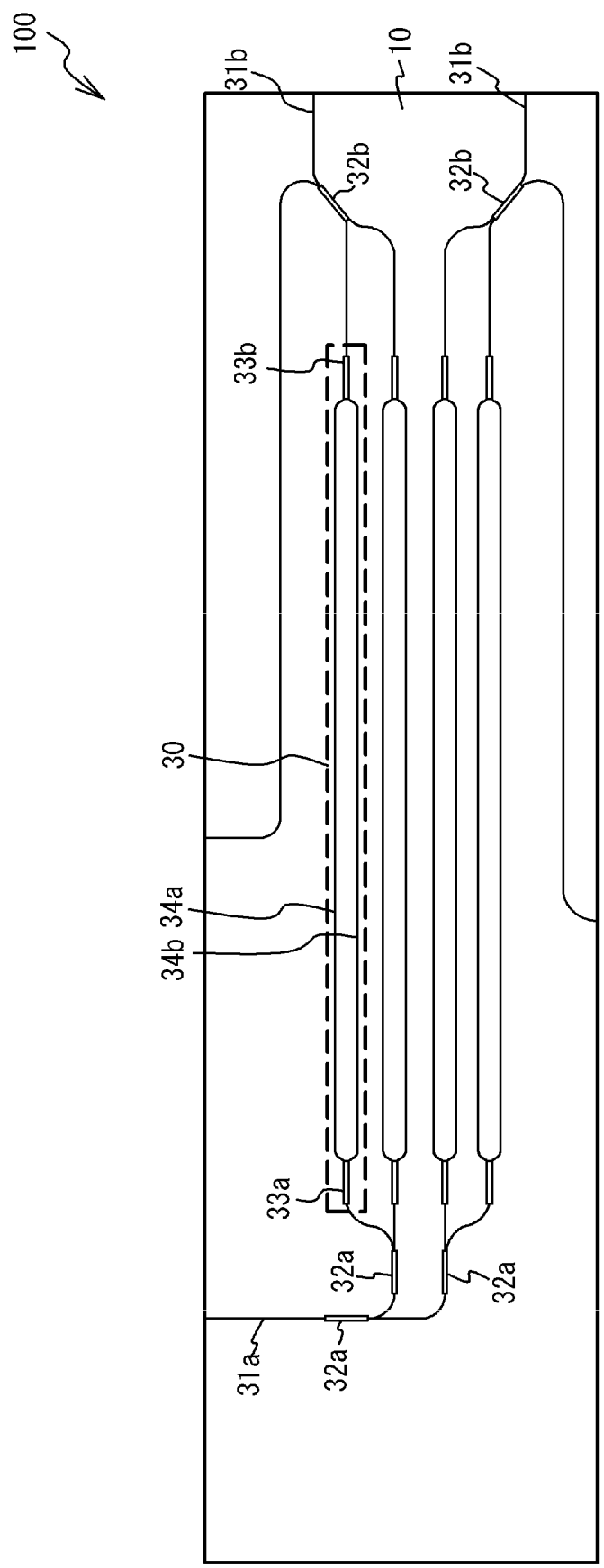
FIG. 1 is a plan view of an optical waveguide portion of an optical modulator according to a first embodiment.

Description of Embodiments of the Present Invention

First of all, the contents of embodiments of the present invention will be listed and described.

An embodiment of the present invention is (1) a semiconductor device that includes: a semiconductor layer formed on a substrate; a first resin layer formed on the semiconductor layer; a second resin layer formed on the first resin layer; a first wiring layer that is formed on the semiconductor layer and is buried in the second resin layer; a second wiring layer that is formed on the second resin layer and the first wiring layer, and is electrically connected to the first wiring layer; and a first inorganic insulating film covering the second resin layer and the second wiring layer. In this semiconductor device, the area of the first wiring layer is larger than the area of the second wiring layer. As the area of the first wiring layer is larger than the area of the second wiring layer, the stress to be applied to the first inorganic insulating film can be reduced. As a result, crack formation in the first inorganic insulating film can be reduced or prevented.

(2) The end portions of the first wiring layer may be located on the outer side of the end portions of the second wiring layer, and surround the second wiring layer. With this, the stress can be more effectively reduced, and crack formation in the first inorganic insulating film can be reduced or prevented.

(3) A length of the first wiring layer may be greater than a length of the second wiring layer by not less than 4 μm and not more than 14 μm. With this, the stress can be more effectively reduced, and crack formation in the first inorganic insulating film can be reduced or prevented.

(4) The first wiring layer and the second wiring layer may contain gold. With this, the stress can be more effectively reduced, and crack formation in the first inorganic insulating film can be reduced or prevented.

(5) The thickness of the first wiring layer may be not smaller than 0.8 μm and not greater than 2.0 μm, and the thickness of the second wiring layer may be not smaller than 2.5 μm and not greater than 5.0 μm. With this, the stress can be more effectively reduced, and crack formation in the first inorganic insulating film can be reduced or prevented.

(6) The first inorganic insulating film may contain silicon nitride, silicon oxide, or silicon oxynitride. These materials exhibit high adhesiveness to resin, and thus, the adhesiveness of the second wiring layer increases.

(7) The semiconductor device may further include: a second inorganic insulating film formed between the semiconductor layer and the first resin layer; a third inorganic insulating film formed between the first resin layer and the second resin layer; and a fourth inorganic insulating film formed between the second resin layer and the first inorganic insulating film. The inorganic insulating films exhibit high adhesiveness to resin, and accordingly, high adhesiveness is achieved between each two adjacent layers among the layers from the semiconductor layer to the second wiring layer. Further, as the stress is reduced, crack formation in the first inorganic insulating film can be reduced or prevented.

(8) The second resin layer and the fourth inorganic insulating film may have an opening at a position overlapping the first wiring layer, and the second wiring layer may be formed in the opening. With this, the second wiring layer is brought into contact with the first wiring layer, and is electrically connected to the first wiring layer. Being surrounded by the first resin layer and the second resin layer, the first wiring layer and the second wiring layer become difficult to peel off.

(9) The semiconductor layer may be compound semiconductor layers stacked on the substrate, the semiconductor layer may include a mesa formed with the compound semiconductor layers, the side surfaces of the mesa may be buried with the first resin layer, the area of the mesa may be larger than the area of the first wiring layer, and the first wiring layer may be formed above the mesa. There is a possibility that a pillar will appear on the substrate. As the first wiring layer is formed above the mesa, the first wiring layer and the second wiring layer can be located farther from the pillar.

(10) A method of manufacturing a semiconductor device includes: growing a semiconductor layer on a substrate; forming a mesa by performing dry etching on the semiconductor layer; a step of forming a first resin layer on the semiconductor layer, the first resin layer burying the mesa; forming a first wiring layer above the mesa; forming a second resin layer on the first resin layer; forming a second wiring layer on the second resin layer, the second wiring layer being electrically connected to the first wiring layer; and forming a first inorganic insulating film covering the second resin layer and the second wiring layer. In this semiconductor device, the area of the first wiring layer is larger than the area of the second wiring layer. As the area of the first wiring layer is larger than the area of the second wiring layer, the stress to be applied to the first inorganic insulating film can be reduced. As a result, crack formation in the first inorganic insulating film can be reduced or prevented.

Details of Embodiments of the Present Invention

A description will be given embodiments of optical modulation devices of embodiments of the present invention, with drawings. The present invention is not limited to the specifically disclosed embodiments and variations but may include other embodiments and variations without departing from the scope of the present invention.

First Embodiment (Optical Modulator)

FIG. 1 is a plan view of an optical waveguide portion of an optical modulator 100 according to a first embodiment.

As shown in FIG. 1, the optical modulator 100 (the semiconductor device) has the following components on a substrate 10: an input waveguide 31a, output waveguides 31b, optical couplers 32a and 32b, and Mach-Zehnder modulators 30. The input waveguide 31a, the output waveguides 31b, and the optical couplers 32a and 32b are formed with mesa-shaped optical waveguides. The optical couplers 32a and 32b are Multimode-Interferometer (MMI) optical couplers. The Mach-Zehnder modulators 30 are a combination of paths formed with mesa-shaped optical waveguides. Light that is input from the input waveguide 31a is divided by the optical couplers 32a. After passing through the Mach-Zehnder modulators 30, the light is multiplexed by the optical couplers 32b, and is output to the output waveguides 31b. The size of the optical modulator 100 is 10 mm×4 mm, for example.

Each Mach-Zehnder modulator 30 includes the following components on the substrate 10: two optical couplers 33a and 33b, and two arm waveguides 34a and 34b connected between the two optical couplers 33a and 33b. The optical couplers 33a and 33b and the arm waveguides 34a and 34b are formed with mesa-shaped optical waveguides. The optical coupler 33a divides light input from the input waveguide 31a. The two arm waveguides 34a and 34b transmit the light divided by the optical coupler 33a. The optical coupler 33b combines the light transmitted through the two arm waveguides 34a and 34b. The optical couplers 33a and 33b are MMI optical couplers.

Figure 2:
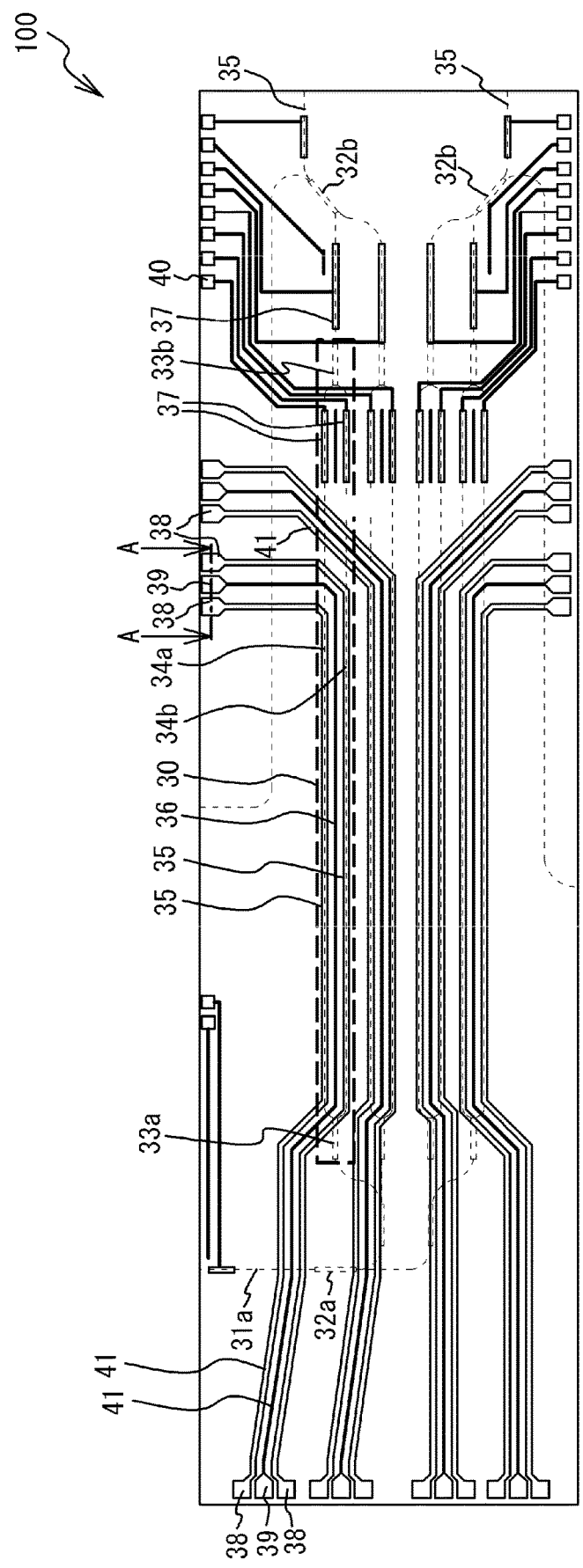
FIG. 2 is a plan view of the optical modulator according to the first embodiment.

FIG. 2 is a plan view of the optical modulator 100. In FIG. 2, the optical waveguide portion described above with reference to FIG. 1 is indicated by thin dotted lines. In the optical modulator 100 according to the first embodiment, the mesa-shaped optical waveguides are buried with resin.

A wiring pattern includes modulation electrodes 35, a ground electrode 36, and phase regulation electrodes 37. The modulation electrodes 35 are disposed on the arm waveguides 34a and 34b of the Mach-Zehnder modulator 30, and are connected to signal bonding pads 38 via connecting wiring lines 41. The ground electrode 36 is disposed between the arm waveguide 34a and the arm waveguide 34b, and is connected to ground bonding pads 39 via connecting wiring lines 41. The phase regulation electrodes 37 are disposed at positions different from the modulation electrodes 35 on the arm waveguides 34a and 34b of the Mach-Zehnder modulator 30, and are connected to DC electrode pads 40.

When a high-frequency electrical signal is supplied from the bonding pads 38 to the modulation electrodes 35, an electrical signal at a high frequency (about 20 GHz, for example) flows between the modulation electrodes 35 and the ground electrode 36. This causes a change in the refractive index of the arm waveguides 34a and 34b, and a change in the phase of the light propagating in the arm waveguides 34a and 34b. As a result, the light propagating in the arm waveguides 34a and 34b is subjected to phase modulation, is turned into a modulated optical signal, and is output to the output waveguide 31b.

When a direct-current voltage is supplied from the DC electrode pads 40 to the phase regulation electrodes 37, the refractive index of the arm waveguides 34a and 34b shifts by a constant amount. The magnitude of the direct-current voltage is set at such a value (an optimum value) that the light propagating in the arm waveguides 34a and 34b is modulated in a preferred manner by the electrical signal supplied to the modulation electrodes 35. In other words, the phase of the light propagating in the arm waveguides 34a and 34b is regulated by the phase regulation electrodes 37 so that the light propagating in the arm waveguides 34a and 34b is modulated in a preferred manner.

The optimum value of the direct-current voltage to be supplied to the phase regulation electrodes 37 depends on the difference in optical path length between the arm waveguides 34a and 34b. The difference in optical path length between the arm waveguides 34a and 34b varies with the wavelength of light propagating in the arm waveguides 34a and 34b, for example. With the wavelength of light being in the range of 1530 nm to 1570 nm, for example, light of a first wavelength enters the optical modulator 100 at a first instant, and light of a second wavelength switching from the first wavelength enters the optical modulator 100 at a second instant. Therefore, a table of the relationship between the wavelength of incident light and the value of the direct-current voltage to be supplied is prepared beforehand, and, at each time of operation, the value of the direct-current voltage is determined on the basis of this relationship table. The difference in the optical path length between the arm waveguides 34a and 34b also varies with the difference in temperature between the arm waveguides 34a and 34b. Therefore, the optical modulator 100 is mounted on a thermoelectric cooler (TEC), and is used at a constant temperature (70 degrees C., for example).

Figure 3A:
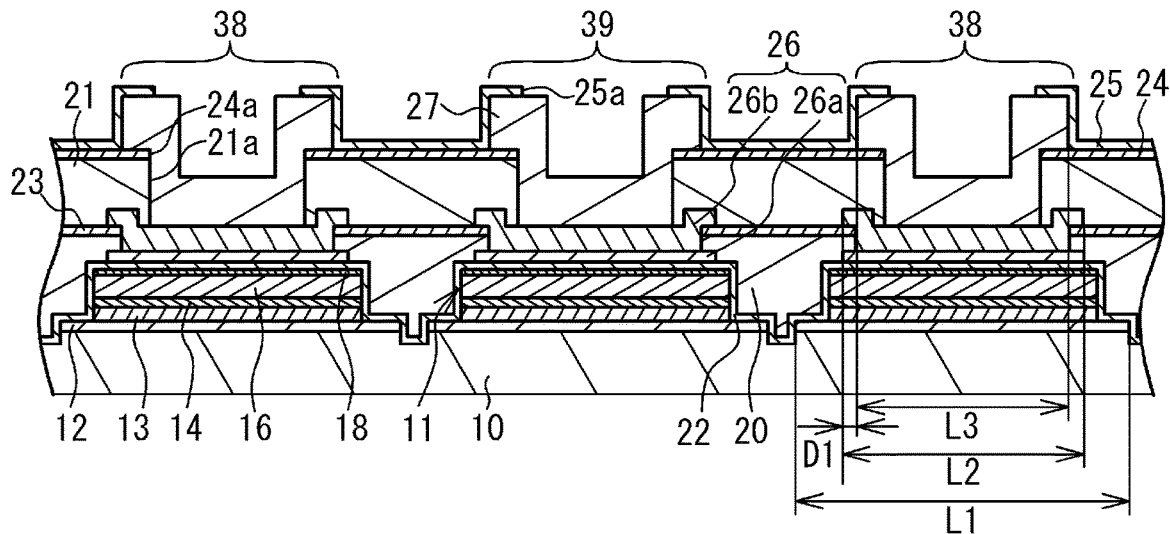
FIGS. 3A and 3B are cross-sectional views of portions near bonding pads.
Figure 3B:
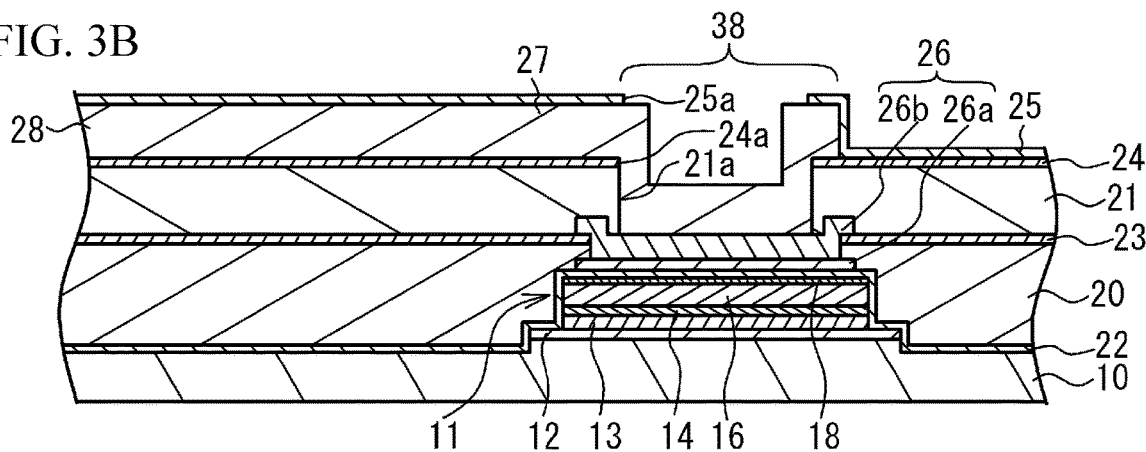
Figure 3C:
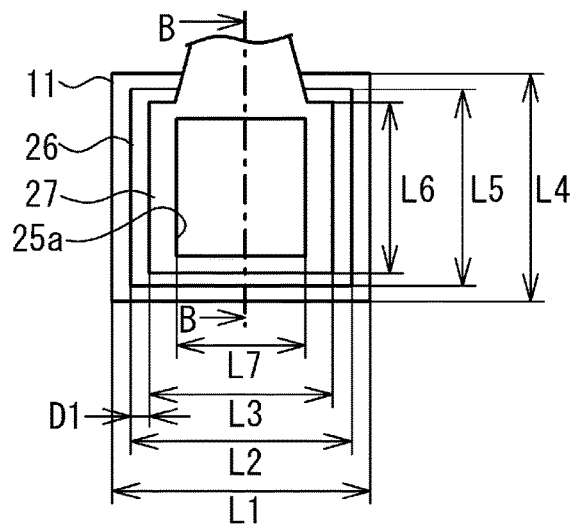
FIG. 3C is an enlarged plan view of a bonding pad.
Figure 4A:
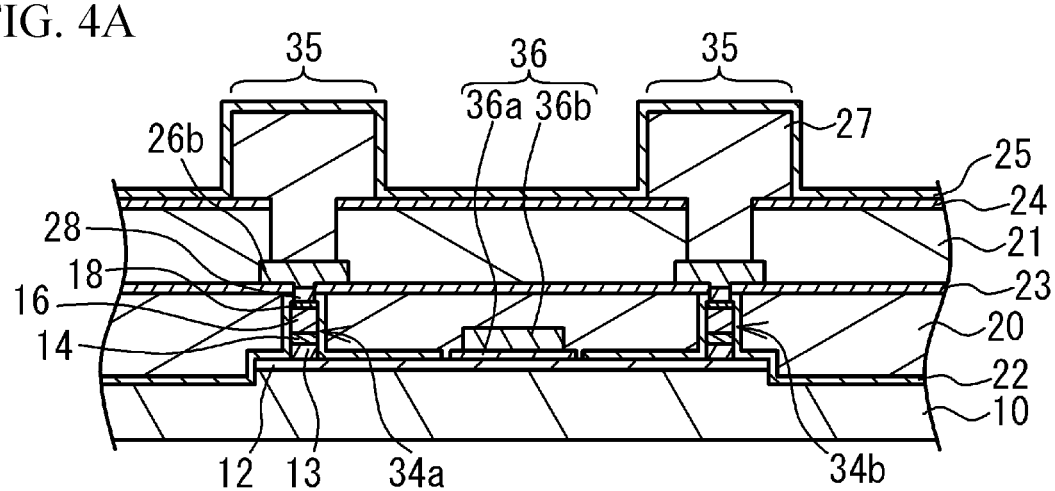
FIGS. 4A and 4B are cross-sectional views of portions near arm waveguides.
Figure 4B:
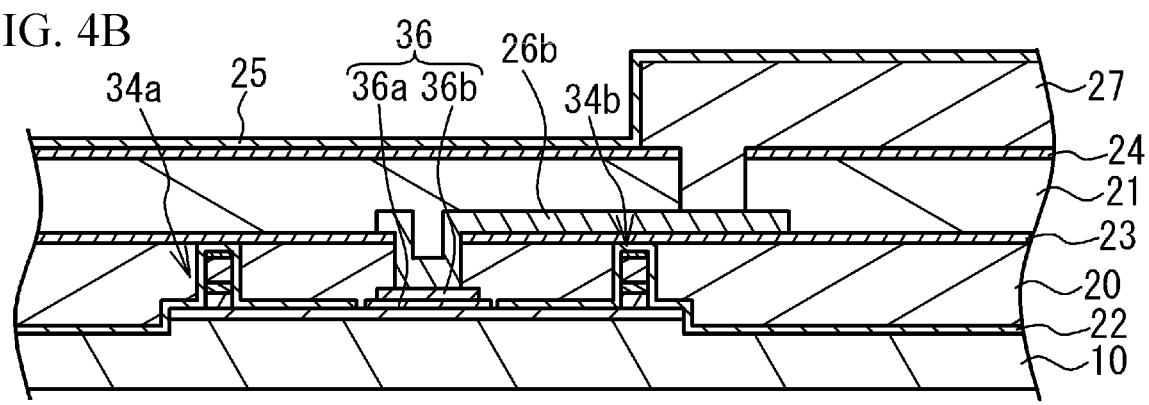

FIGS. 3A and 3B are cross-sectional views of portions near bonding pads. FIG. 3A shows a cross-section taken along the line A-A defined in FIG. 2. FIG. 3B shows a cross-section taken along the line B-B defined in FIG. 3C. FIG. 3C is an enlarged plan view of a bonding pad 38. FIGS. 4A and 4B are cross-sectional views of portions near the arm waveguides 34a and 34b.

As shown in FIGS. 3A, 3B, 4A, and 4B, a lower cladding layer 12, a lower cladding layer 13, a core layer 14, an upper cladding layer 16, and a contact layer 18 are sequentially stacked on the substrate 10.

The substrate 10 is a semiconductor substrate formed with a semi-insulating indium phosphide, for example. The lower cladding layers 12 and 13 are formed with n-type InP doped with silicon (Si), for example. The thickness of the lower cladding layer 12 is 500 nm, for example, and the thickness of the lower cladding layer 13 is 800 nm, for example. The core layer 14 is formed with gallium indium arsenide phosphide (GaInAsP) of 500 nm in thickness, for example, and has a multiple quantum well (MQW) structure. The upper cladding layer 16 is formed with 1300-nm thick p-type InP doped with zinc (Zn), for example. The contact layer 18 is formed with 200-nm thick p-type InGaAs doped with Zn, for example.

The compound semiconductor layers (the lower cladding layer 12, the lower cladding layer 13, the core layer 14, the upper cladding layer 16, and the contact layer 18) on the substrate 10 form mesas 11 as illustrated in FIGS. 3A and 3(b), and also form the arm waveguides 34a and 34b as illustrated in FIGS. 4A and 4B.

The compound semiconductor layers are divided between the mesas 11, and the mesas 11 are electrically insulated from one another. The distance between adjacent mesas 11 is 20 μm, for example. The arm waveguides 34a and 34b are electrically connected by the lower cladding layer 12 extending from the arm waveguide 34a to the arm waveguide 34b. The width of each of the arm waveguides 34a and 34b is 1.5 μm, for example.

Resin layers 20 and 21, and insulating films 22, 23, 24, and 25 are formed on the substrate 10. The insulating film 22 (the second inorganic insulating film) covers the upper surface of the substrate 10, the side surfaces and the upper surfaces of the mesas 11, and the side surfaces of the arm waveguides 34a and 34b. The resin layer 20 (the first resin layer) is disposed on the upper surface of the insulating film 22, and buries the side surfaces of the mesas 11 and the arm waveguides 34a and 34b. The insulating film 23 (the third inorganic insulating film) is provided on the upper surface of the resin layer 20, and the resin layer 21 (the second resin layer) is provided on the upper surface of the insulating film 23. The insulating film 24 (the fourth inorganic insulating film) is provided on the upper surface of the resin layer 21, and the insulating film 25 (the first inorganic insulating film) is provided on the upper surface of the insulating film 24. The resin layer 21 has openings 21a, and the insulating film 24 has openings 24a. The openings 21a overlap the openings 24a in the thickness direction, and further overlap the mesas 11.

As shown in FIGS. 3A and 3B, the bonding pads 38 and 39 are disposed above the mesas 11 and on the upper surface of the insulating film 22. The bonding pads 38 and 39 each has wiring layers 26 and 27 stacked in this order.

The wiring layer 26 (the first wiring layer) includes a foundation layer 26a in contact with the upper surface of the insulating film 22, and a plating layer 26b in contact with the upper surface of the foundation layer 26a. The wiring layer 26 is buried in the resin layer 20 and the resin layer 21, and overlap the openings 21a and 24a. The wiring layer 27 (the second wiring layer) is in contact with the upper surface of the plating layer 26b. The wiring layer 27 is formed to extend from the inside of the openings 21a to the upper surface of the insulating film 24, and is electrically connected to the wiring layer 26. The end portions of the wiring layer 27 are located on the outer side of the openings 21a.

The foundation layer 26a is a metal layer (Ti/Pt/Au) formed by stacking a 50-nm thick titanium (Ti) layer, a 50-nm thick platinum (Pt) layer, and a 900-nm thick gold (Au) layer in this order, for example. Each of the plating layer 26b and the wiring layer 27 is a metal layer (TiW/Pt/Au) formed by stacking a 50-nm thick titanium tungsten (TiW) layer, a 50-nm thick platinum (Pt) layer, and a gold (Au) layer in this order, for example. The thickness of the plating layer 26b is 1 μm, for example, and the thickness of the wiring layer 27 is 4 μm, for example.

The resin layers 20 and 21 are formed with benzocyclobutene (BCB) or the like, for example. The thickness of the resin layer 20 is 2.5 μm, for example, and the thickness of the resin layer 21 is 3.5 μm, for example. The insulating film 24 is a 0.3-μm thick silicon oxide ($SiO_2$) film, for example, and the insulating films 22 and 23 are 0.3-μm thick silicon oxynitride (SiON) films, for example.

As shown in FIGS. 4A and 4B, an ohmic layer 28, the plating layer 26b, and the wiring layer 27 are stacked in this order on the arm waveguides 34a and 34b. The ohmic layer 28 is in contact with the upper surface of the contact layer 18, the plating layer 26b is in contact with the upper surface of the ohmic layer 28, and the wiring layer 27 is in contact with the upper surface of the plating layer 26b. The ohmic layer 28 is formed by stacking a 30-nm thick Pt layer, a 50-nm thick Ti layer, a 50-nm thick Pt layer, and a 200-nm thick Au layer in this order, for example. The width of the ohmic layer 28 is 1 μm, for example.

As shown in FIGS. 4A and 4B, the ground electrode 36 is disposed between the arm waveguides 34a and 34b, and on the upper surface of the insulating film 22. As shown in FIG. 4B, the ground electrode 36 includes an n-electrode 36a and an electrode 36b stacked in this order, and is electrically connected to the wiring layer 27 via the plating layer 26b.

The n-electrode 36a is formed with an alloy of Au, germanium (Ge), and nickel (Ni), and is 200 nm in thickness, for example. The electrode 36b is formed by stacking a 50-nm thick Ti layer, a 50-nm thick Pt layer, and a 900-nm thick Au layer in this order, for example. The width of the n-electrode 36a is 17 µm, for example, and the width of the electrode 36b is 15 µm, for example.

As shown in FIGS. 3A, 3B, 4A, and 4B, the insulating film 25 covers the insulating film 24 and the wiring layer 27. As shown in FIGS. 3A and 3B, the insulating film 25 has openings 25a. The openings 25a overlap the mesas 11, the openings 21a and 24a, and the wiring layer 27, and the wiring layer 27 is exposed through the openings 25a. A length L7 of each opening 25a is 90 µm, for example.

As shown in FIG. 3C, a length L1 of each mesa 11 is greater than a length L2 of the wiring layer 26, and the length L2 of the wiring layer 26 is greater than a length L3 of the wiring layer 27. A length L4 of each mesa 11 is greater than a length L5 of the wiring layer 26, and the length L5 of the wiring layer 26 is greater than a length L6 of the wiring layer 27.

Figure 5A:
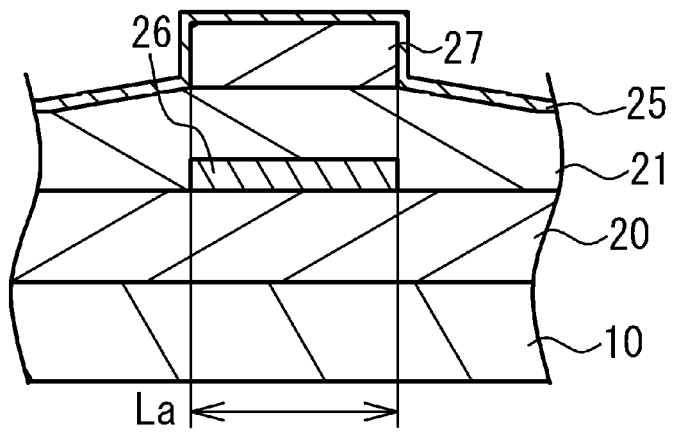
FIGS. 5A through 5C are schematic views of examples of simulation models.
Figure 5B:
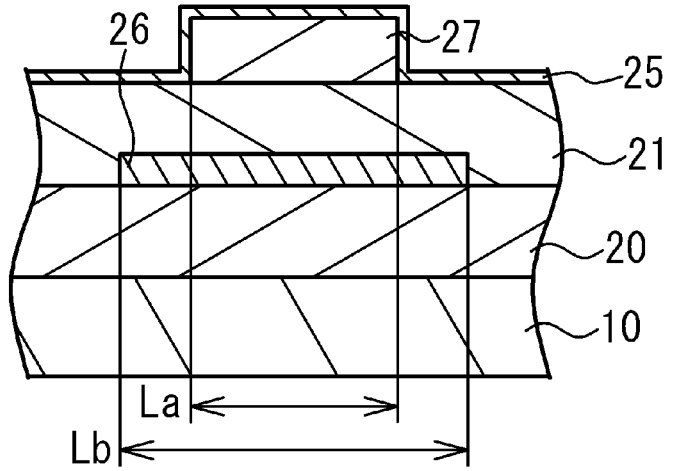
Figure 5C:
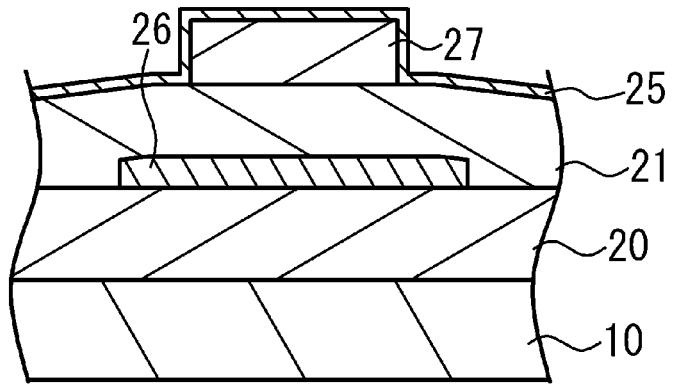

To set the sizes of the wiring layers, a stress simulation was conducted. FIGS. 5A through 5C are schematic views of examples of simulation models. In the simulation, models each formed by stacking the resin layers 20 and 21 and the insulating film 25 on the substrate 10 are used. The wiring layer 26 is located on the resin layer 20, and is buried in the resin layer 21. The wiring layer 27 is located on the resin layer 21, and is covered with the insulating film 25.

The substrate 10 is formed with InP, and has a Young's modulus of 60700 MPa, a Poisson's ratio of 0.3, and a linear expansion coefficient of $4.5 \times 10^{-6}$/K. The resin layers 20 and 21 are formed with BCB, and have a Young's modulus of 2900 MPa, a Poisson's ratio of 0.34, and a linear expansion coefficient of $52 \times 10^{-6}$/K. The wiring layers 26 and 27 are formed with Au, and have a Young's modulus of 79000 MPa, a Poisson's ratio of 0.3, and a linear expansion coefficient of $14.2 \times 10^{-6}$/K. The insulating film 25 is formed with SiON, and has a Young's modulus of 180000 MPa, a Poisson's ratio of 0.24, and a linear expansion coefficient of $1.5 \times 10^{-6}$/K. The resin layers, the wiring layers, and the like expand and contract with temperature changes, and therefore, stress is generated.

In the simulation, three models were used. In a model A, the wiring layer 26 and the wiring layer 27 have the same length La as shown in FIG. 5A, and La is 100 µm, for example. In models B and C, a length Lb of the wiring layer 26 is greater than the length La of the wiring layer 27 as shown in FIG. 5B. In the model B, the length La of the wiring layer 27 is 100 µm, and the length Lb of the wiring layer 26 is 104 µm. In the model C, the length La is 100 µm, and the length Lb is 108 µm. Specifically, the wiring layer 26 protrudes from either end of the wiring layer 27 by 2 µm or 4 µm. In the models A through C, the thickness of the wiring layer 26 is 1.2 µm, and the thickness of the wiring layer 27 is 4.5 µm. Temperature was changed from 280 degrees C. to 0 degrees C., and the stress generated was calculated.

In the model A shown in FIG. 5A, the stress generated at a corner of the wiring layer 27 is 811.9 MPa. When a crack appears in the insulating film 25 due to the stress, moisture intrudes into the resin layers 20 and 21, resulting in oxidation.

In the models B and C shown in FIG. 5B, on the other hand, the wiring layer 26 is larger than the wiring layer 27. Accordingly, the wiring layer 26 contracts with the insulating film 25, as shown in FIG. 5C. As a result, the stress is reduced. In the model B in which the length Lb of the wiring layer 26 is 104 µm, the stress generated at a corner of the wiring layer 27 is 798.53 MPa. In the model C in which the length Lb is 108 µm, the stress is 758.7 MPa. In other words, as the area of the wiring layer 26 is made larger than the wiring layer 27, it is possible to reduce stress, and prevent cracks from appearing in the insulating film 25.

To reduce stress on the basis of the simulation, the area of the wiring layer 26 is made larger than the wiring layer 27 as shown in FIG. 3C. The wiring layer 26 protrudes outward from the end portions of the wiring layer 27, and the sides of the wiring layer 26 are longer than the corresponding sides of the wiring layer 27. The lengths L3 and L6 of the wiring layer 27 are not smaller than 80 µm and not greater than 100 µm, for example. The lengths L2 and L5 of the wiring layer 26 are not smaller than 104 µm and not greater than 114 µm, for example. The distance D1 between an end portion of the wiring layer 26 and the corresponding end portion of the wiring layer 27 is not shorter than 2 µm and not longer than 7 µm, for example.

Note that each mesa 11 protrudes outward from the end portions of the wiring layer 26, and the sides of each mesa 11 are longer than the corresponding sides of the wiring layer 26. The lengths L1 and L4 of each mesa 11 is greater than L2 and L5 by 1 to 5 µm on one side, for example.

(Manufacturing Method)

FIGS. 6A through 9D are cross-sectional views illustrating an example of a method of manufacturing the optical modulator 100. FIGS. 6A through 8C show cross-sections corresponding to FIG. 3A, and FIGS. 9A through 9D show cross-sections corresponding to FIG. 4A.

Figure 6A:
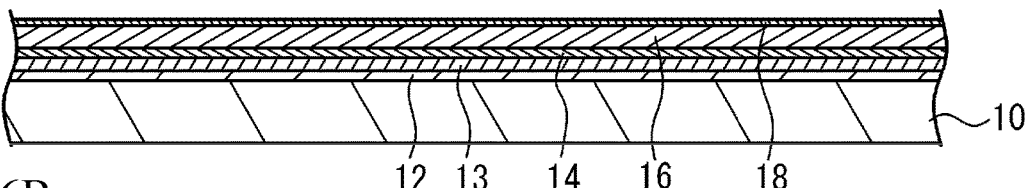
FIGS. 6A through 6F are cross-sectional views illustrating an example method of manufacturing the optical modulator.

As shown in FIG. 6A, the lower cladding layer 12, the lower cladding layer 13, the core layer 14, the upper cladding layer 16, and the contact layer 18 are epitaxially grown in this order on the substrate 10 by metal organic vapor phase epitaxy (MOVPE) or the like, for example.

Figure 6B:
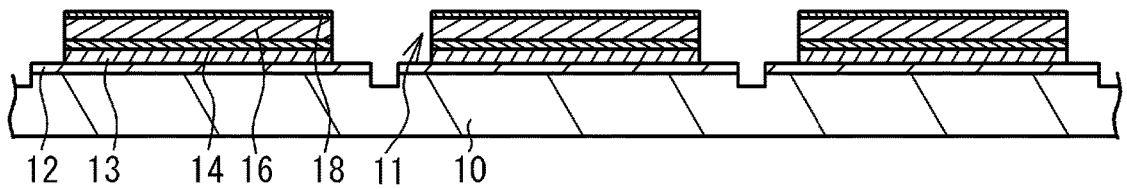
Figure 9A:
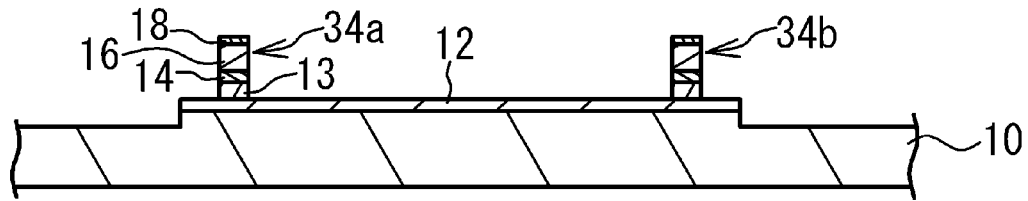
FIGS. 9A through 9D are cross-sectional views illustrating the example method of manufacturing the optical modulator.

As shown in FIGS. 6B and 9A, the compound semiconductor layers are subjected to photolithography and dry etching, so that the mesas 11 and the arm waveguides 34a and 34b are formed. The surface of the substrate 10 is exposed through the portions of the wafer subjected to the etching, and the portions covered with a mask and not subjected to the etching turn into the mesas 11 and the arm waveguides 34a and 34b. As shown in FIG. 6B, the mesas 11 are not connected by the conductive compound semiconductor layers, but are electrically insulated from one another.

Figure 6C:
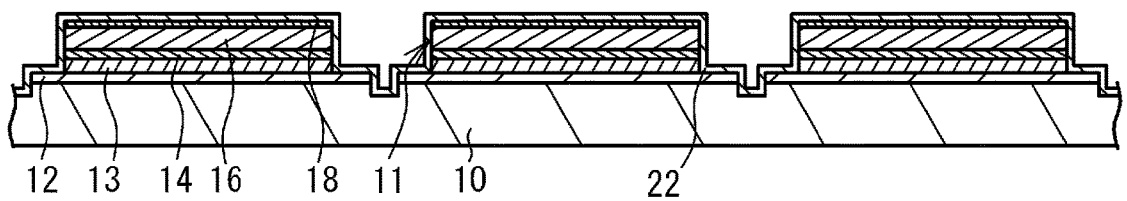

As shown in FIG. 6C, the insulating film 22 is formed by thermal CVD, for example. The insulating film 22 covers the substrate 10 and the mesas 11, and, though not shown in the drawings, also covers the arm waveguides 34a and 34b.

Figure 6D:
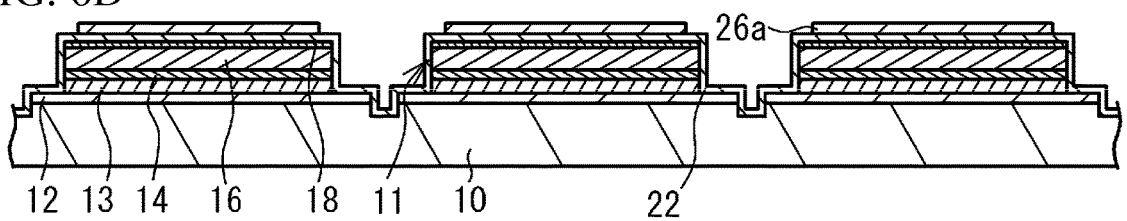
Figure 9B:
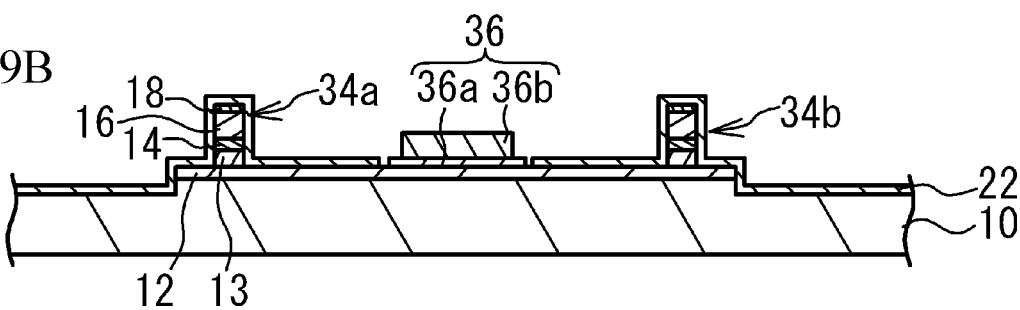

As shown in FIG. 6D, the foundation layer 26a is formed above the mesas 11 by vapor deposition and a lift-off technique, for example. As shown in FIG. 9B, the ground electrode 36 is formed between the arm waveguides 34a and 34b. For example, the n-electrode 36a is formed by vapor deposition and lifting-off, for example, and the electrode 36b is formed on the n-electrode 36a by vapor deposition and a lift-off technique.

Figure 6E:
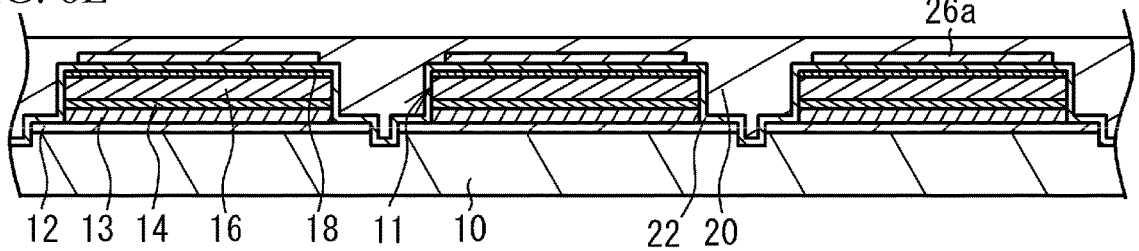
Figure 6F:
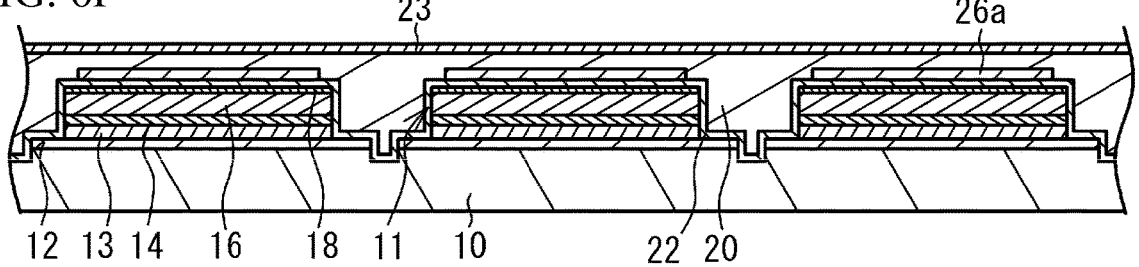

As shown in FIG. 6E, the upper surface of the insulating film 22 is spin-coated with a precursor of BCB resin, and the precursor of BCB resin is subjected to thermal curing at about 350 degrees C. for two minutes, to form the resin layer 20. The mesas 11 are buried in the resin layer 20. The arm waveguides 34a and 34b are also buried in the resin layer 20. As shown in FIG. 6F, the insulating film 23 is formed on the resin layer 20 by plasma CVD, for example.

Figure 7A:
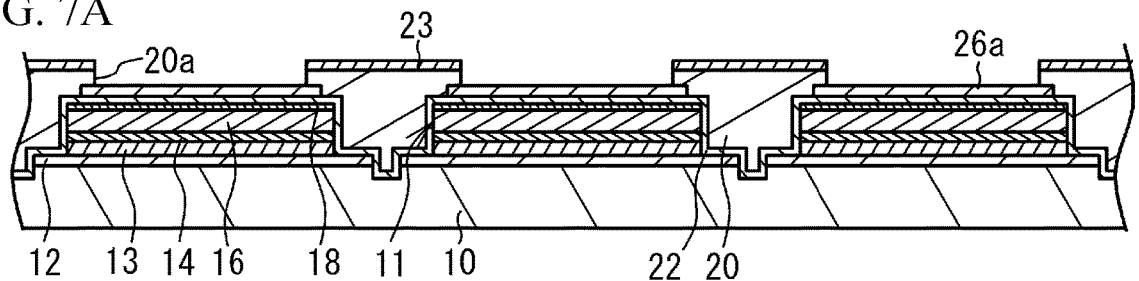
FIGS. 7A through 7D are cross-sectional views illustrating the example method of manufacturing the optical modulator.
Figure 7B:
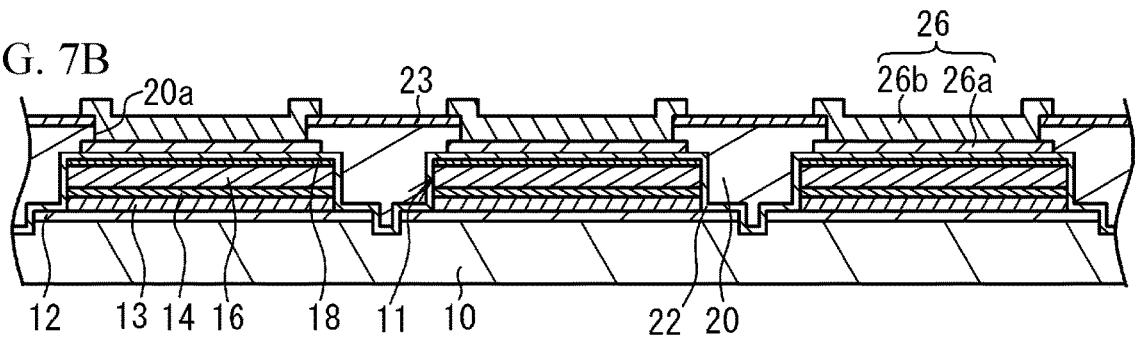
Figure 9C:
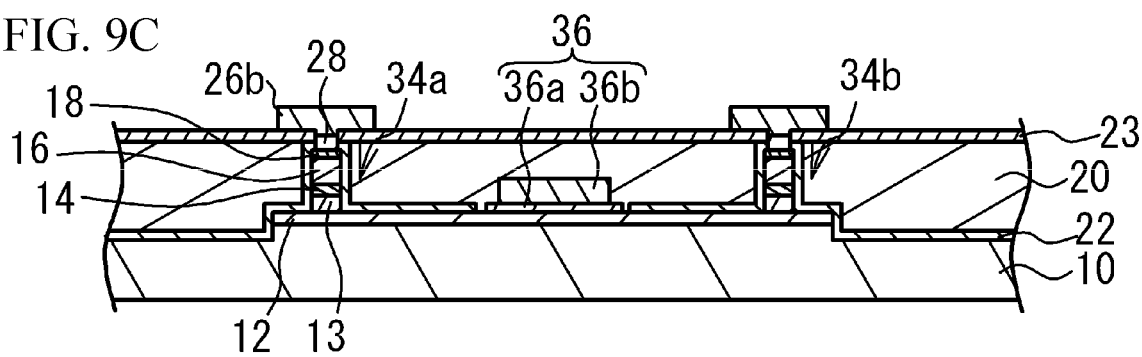

As shown in FIG. 7A, resist patterning and dry etching is performed on the resin layer 20, to form openings 20a above the mesas 11. The foundation layer 26a is exposed through the openings 20a. As shown in FIG. 7B, the plating layer 26b is formed in the openings 20a and on the upper surface of the foundation layer 26a. The foundation layer 26a and the plating layer 26b constitute the wiring layer 26. As shown in FIG. 9C, the ohmic layer 28 is formed on the upper surfaces of the arm waveguides 34a and 34b by vapor deposition and lifting-off, for example, and the plating layer 26b is formed on the ohmic layer 28.

Figure 7C:
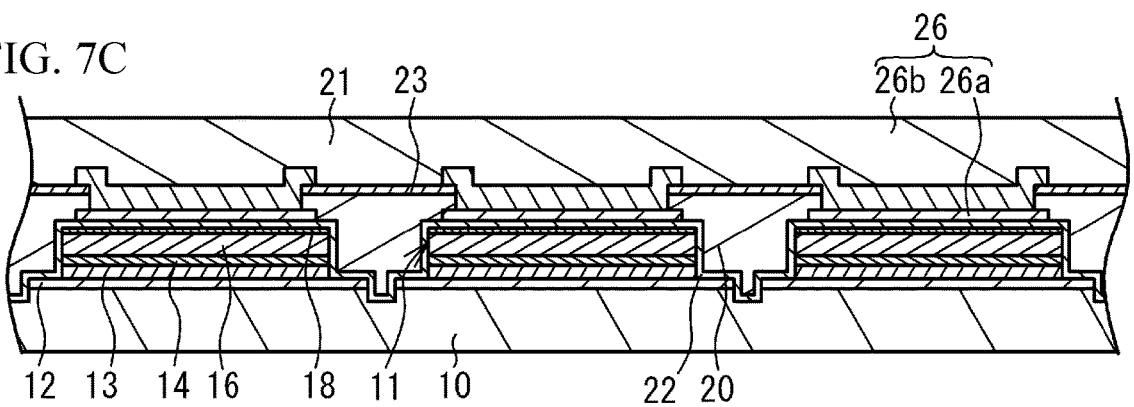
Figure 7D:
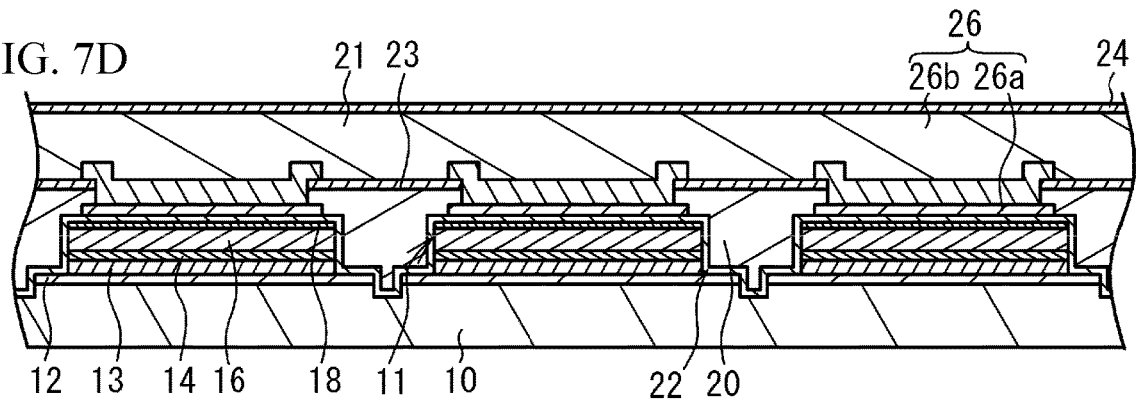

As shown in FIG. 7C, the upper surface of the insulating film 22 is spin-coated with a precursor of BCB resin, for example, and the precursor of BCB resin is subjected to thermal curing at about 350 degrees C. for two minutes, to form the resin layer 21. As shown in FIG. 7D, the insulating film 24 is formed on the resin layer 21 by a sputtering technique.

Figure 8A:
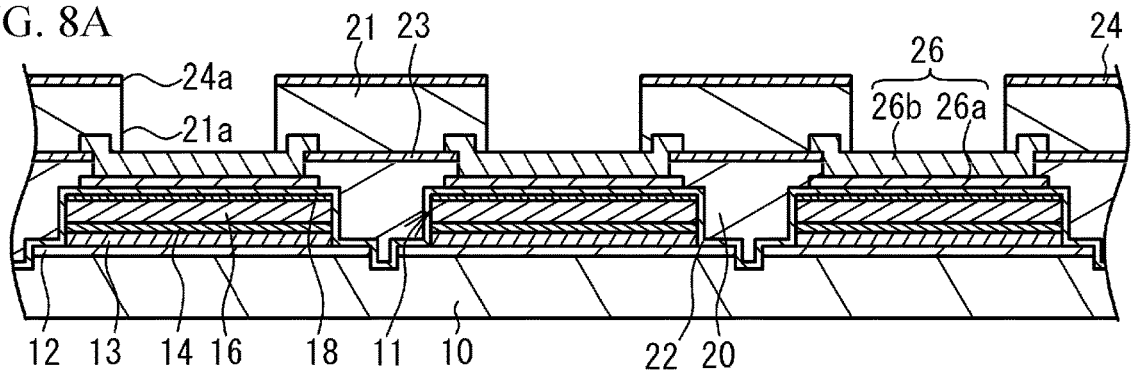
FIGS. 8A through 8C are cross-sectional views illustrating the example method of manufacturing the optical modulator.
Figure 8B:
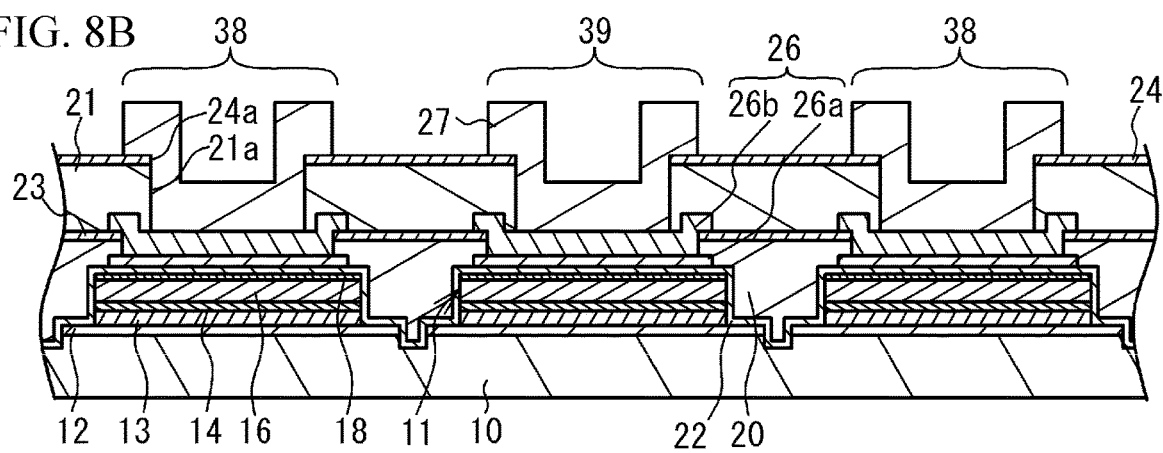

As shown in FIG. 8A, resist patterning and reactive ion etching (RIE) is performed on the insulating film 24 and the resin layer 21, so that the openings 21a and 24a are formed on the wiring layer 26. As shown in FIG. 8B, the wiring layer 27 is formed on the upper surface of the wiring layer 26 by a sputtering technique and a plating process, for example.

Figure 8C:
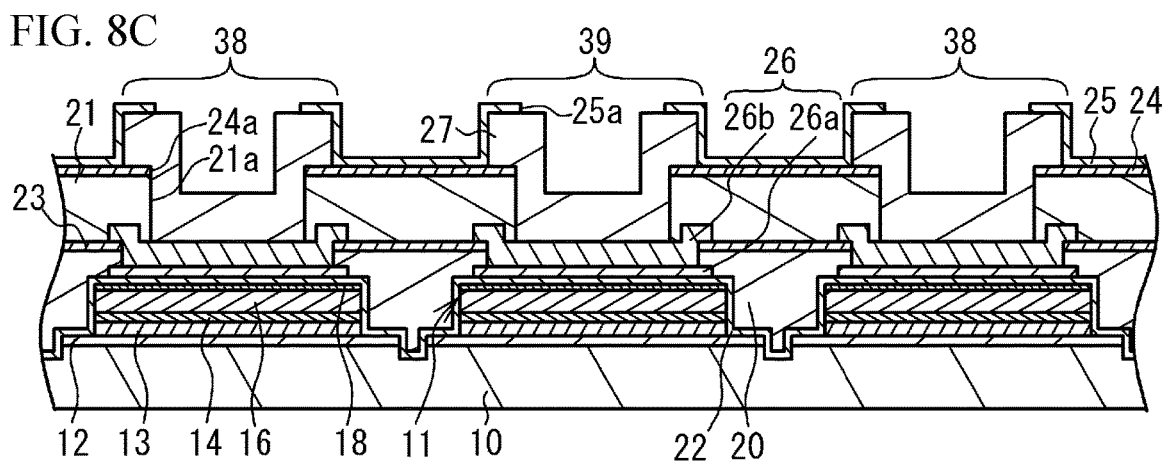
Figure 9D:
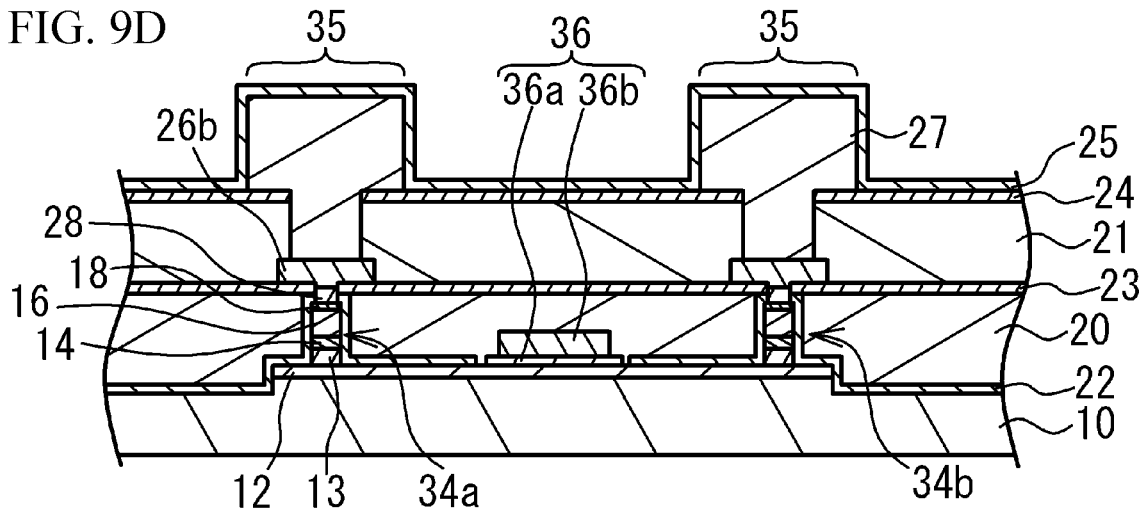

As shown in FIG. 8C, the insulating film 25 covering the resin layer 21 and the wiring layer 27 is formed by plasma CVD. As shown in FIG. 9D, the wiring layer 27 and the insulating film 25 are also formed on the arm waveguides 34a and 34b. In the formation of the insulating film 25, the substrate 10 is heated to about 270 degrees C., for example, in a CVD apparatus, and is then cooled to room temperature. As shown in FIG. 8C, the openings 25a are formed in the insulating film by resist patterning and RIE, to expose the wiring layer 27. Wafer dicing and the like is then performed, to complete the optical modulator 100.

According to the first embodiment, the area of the wiring layer 26 is larger than the wiring layer 27, and accordingly, the stress to be generated by temperature change or the like can be reduced. Specifically, as shown in FIGS. 5B and 5C, the wiring layer 26 protruding outward from the wiring layer 27 contracts, to reduce the stress to be applied to the insulating film 25. As a result, cracks are prevented from forming in the insulating film 25. Thus, it is possible to protect the resin layers 20 and 21 and the others with the insulating film 25.

Stress increases at the corners and the sides of the wiring layer 27. As shown in FIG. 3C, the end portions of the wiring layer 26 are located on the outer side of the end portions of the wiring layer 27, and surround the wiring layer 27. Thus, it is possible to reduce stress, and effectively prevent cracks in the insulating film 25.

The lengths L2 and L5 of the wiring layer 26 are preferably greater than the lengths L3 and L6 of the wiring layer 27 by not less than 4 μm and not more than 14 μm, for example. With this, it is possible to effectively reduce stress. The lengths L2 and L5 are greater than the lengths L3 and L6 by about 2% to 15%. The protrusions of the end portions of the wiring layer 26 are almost the same at both sides of the wiring layer 26, for example. With this, it is possible to prevent concentration of stress.

The wiring layer 26 includes the plating layer 26b formed with Au, and the wiring layer 27 also contains Au. The wiring layer 26 that contains Au and is larger than the wiring layer 27 is capable of effectively reducing stress.

The thickness of the wiring layer 26 is not smaller than 0.8 μm and not greater than 2.0 μm, and the thickness of the wiring layer 27 is not smaller than 2.5 μm and not greater than 5.0 μm. With this, it is possible to effectively reduce stress.

The insulating films 22, 23, and 25 are SiON films, for example, and the insulating film 24 is a $SiO_2$ film. The insulating films 22 through 25 may be inorganic insulating films containing SiN, $SiO_2$, or SiON. The adhesiveness between a resin layer and an insulating film, and the adhesiveness between the insulating film 24 and the insulating film 25 are high. Thus, the resin layers 20 and 21 are prevented from peeling off, and the wiring layers 26 and 27 also become difficult to peel off.

The insulating film 22 is formed to extend from the substrate 10 to the upper surfaces of the mesas 11, and the resin layer 20, the insulating film 23, the resin layer 21, and the insulating films 24 and 25 are formed on the insulating film 22. As a resin layer and an insulating film adhere to each other, the resin layers 20 and 21 are prevented from peeling off. Meanwhile, the substrate 10, the resin layers, and the insulating films have different linear expansion coefficients from one another. Further, the resin layers 20 and 21 are subjected to thermal curing, for example, and the insulating films 22 through 25 are formed by CVD or the like, for example. As the wafer is subjected to temperature change from room temperature to several hundreds of degrees C., stress is generated. According to the first embodiment, such stress can be reduced.

The resin layer 21 and the insulating film 25 have the openings 21a and 25a above the mesas 11 and the wiring layer 26, and the wiring layer 27 is formed in the openings 21a and 25a. Because of this, the wiring layer 27 is in contact with the upper surface of the wiring layer 26, and is electrically connected to the wiring layer 26. Further, being surrounded by the resin layers 20 and 21, the bonding pads 38 and 39 become difficult to peel off.

In the dry etching for forming the mesas 11, protrusions (pillars) of the compound semiconductors sometimes remain on the surface of the substrate 10. Due to poor coatability of the insulating film 22 for such pillars, there is a possibility of generation of leakage current, disconnection, or the like. Therefore, the wiring layer 26 is disposed above the mesas 11. As the distances between the surface of the substrate 10 and the bonding pads 38 and 39 become longer, the influence of pillars appearing in the substrate 10 is reduced. The end portions of the mesas 11 may match the end portions of the wiring layers 26, and the area of the mesas 11 and the area of the wiring layer 26 may be the same when viewed in a plan view. However, there is a possibility that a metal remains on the side surfaces of the mesas 11 when the wiring layer 26 is formed. Therefore, as shown in FIG. 3C, the end portions of each mesa 11 are located on the outer side of the wiring layer 26, and the area of the mesas 11 are made larger than the wiring layer 26. In this manner, metal formation on the side surfaces of the mesas 11 can be prevented. Meanwhile, the wiring layer 27 is located above the resin layer 21, and is farther from the surface of the substrate 10 than the wiring layer 26 is. Accordingly, the wiring layer 27 is hardly affected by the pillars.

The mesas 11 and the arm waveguides 34a and 34b have the same layer structure. Accordingly, it is possible to form the mesas 11 and the arm waveguides 34a and 34b by dry etching, and thus, the manufacturing process is simplified.

The substrate 10 and the compound semiconductor layers may be formed with semiconductors other than those described above. The resin layers 20 and 21 may be formed with a resin other than BCB. This embodiment may be applied to a semiconductor device other than the optical modulator 100.

What is claimed is:

1. A semiconductor device comprising:
a semiconductor layer formed on a substrate;
a first resin layer formed on the semiconductor layer;
a second resin layer formed on the first resin layer;
a first wiring layer that is formed on the semiconductor layer and is buried in the second resin layer;
a second wiring layer that is is electrically connected to the first wiring layer;
a first inorganic insulating film covering the second resin layer and the second wiring layer;
a second inorganic insulating film formed between the semiconductor layer and the first resin layer;
a third inorganic insulating film formed between the first resin layer and the second resin layer; and
a fourth inorganic insulating film formed between the second resin layer and the first inorganic insulating film, wherein
the second wiring layer is formed on the second resin layer, on the first wiring layer, and on the fourth inorganic insulating film, and wherein
the first wiring layer and the second wiring layer form a pad,
the first inorganic insulating film has an opening overlapping the pad,
the second wiring layer is exposed through the opening, and
an area of the first wiring layer is larger than an area of the second wiring layer in the pad.

2. The semiconductor device according to claim 1, wherein an end portion of the first wiring layer is located on an outer side of an end portion of the second wiring layer, and surrounds the second wiring layer.

3. The semiconductor device according to claim 1, wherein a length of the first wiring layer is greater than a length of the second wiring layer by not less than 4 μm and not more than 14 μm.

4. The semiconductor device according to claim 1, wherein the first wiring layer and the second wiring layer contain gold.

5. The semiconductor device according to claim 1, wherein
a thickness of the first wiring layer is not smaller than 0.8 μm and not greater than 2.0 μm, and
a thickness of the second wiring layer is not smaller than 2.5 μm and not greater than 5.0 μm.

6. The semiconductor device according to claim 1, wherein the first inorganic insulating film contains silicon nitride, silicon oxide, or silicon oxynitride.

7. The semiconductor device according to claim 1, wherein
the second resin layer and the fourth inorganic insulating film each have an opening at a position overlapping the first wiring layer, and
the second wiring layer is formed in the opening.

8. A semiconductor device comprising:
a semiconductor layer formed on a substrate, the semiconductor layer including a plurality of compound semiconductor layers stacked on the substrate and a mesa formed by the plurality of compound semiconductor layers;
a first resin layer formed on the semiconductor layer;
a second resin layer formed on the first resin layer;
a first wiring layer that is formed on the semiconductor layer and is buried in the second resin layer;
a second wiring layer that is formed on the second resin layer and the first wiring layer, and is electrically connected to the first wiring layer; and
a first inorganic insulating film covering the second resin layer and the second wiring layer, wherein
the first wiring layer and the second wiring layer form a pad,
the first inorganic insulating film has an opening overlapping the pad,
the second wiring layer is exposed through the opening, and
an area of the first wiring layer is larger than an area of the second wiring layer in the pad, and wherein
the mesa overlaps the pad,
side surfaces of the mesa are buried with the first resin layer,
an area of the mesa is larger than the area of the first wiring layer, and
the first wiring layer is formed above the mesa.

* * * * *